(12) United States Patent
Bitman et al.

(10) Patent No.: US 8,547,406 B2
(45) Date of Patent: Oct. 1, 2013

(54) DISPLAY ELEMENT AND A METHOD FOR DRIVING A DISPLAY ELEMENT

(75) Inventors: Andriy Bitman, Dortmund (DE); Dieter Jerosch, Bad Soden (DE); Frank Bartels, Hattingen (DE); Karlheinz Blankenbach, Pforzheim (DE); Juergen Rawert, Kaarst (DE)

(73) Assignee: Advanced Display Technology AG, Appenzell (CH)

( * ) Notice: Subject to any disclaimer, the term of this patent is extended or adjusted under 35 U.S.C. 154(b) by 496 days.

(21) Appl. No.: 12/858,517

(22) Filed: Aug. 18, 2010

(65) Prior Publication Data

US 2011/0063334 A1 Mar. 17, 2011

(30) Foreign Application Priority Data

Aug. 21, 2009 (DE) .......................... 10 2009 038 469

(51) Int. Cl.
*G09G 5/10* (2006.01)
(52) U.S. Cl.
USPC ............. 345/690; 345/695; 345/84; 345/694; 345/5; 345/76; 349/114; 313/113; 313/111
(58) Field of Classification Search
USPC ........................................................ 345/690
See application file for complete search history.

(56) References Cited

U.S. PATENT DOCUMENTS

| | | | | |
|---|---|---|---|---|
| 5,506,929 A * | 4/1996 | Tai et al. | ........................ | 385/146 |
| 5,608,837 A * | 3/1997 | Tai et al. | ........................ | 385/146 |
| 6,037,955 A * | 3/2000 | DeBoer et al. | ............. | 346/140.1 |
| 6,283,602 B1 * | 9/2001 | Kawaguchi et al. | .......... | 362/608 |
| 6,351,260 B1 * | 2/2002 | Graham et al. | ................ | 345/179 |
| 6,538,644 B1 * | 3/2003 | Muraoka | ........................ | 345/175 |
| 6,565,225 B2 * | 5/2003 | Mabuchi et al. | ............. | 362/610 |
| 6,783,269 B2 * | 8/2004 | Pashley et al. | ................ | 362/555 |
| 6,803,900 B1 * | 10/2004 | Berkoff et al. | ................ | 345/102 |
| 6,972,753 B1 * | 12/2005 | Kimura et al. | ................ | 345/175 |
| 7,090,389 B2 * | 8/2006 | Parker et al. | ................... | 362/627 |
| 7,099,553 B1 * | 8/2006 | Graham et al. | ............... | 385/146 |
| 7,161,647 B2 * | 1/2007 | Iijima | ........................... | 349/113 |
| 7,170,506 B2 | 1/2007 | Eldon et al. | | |
| 7,448,775 B2 * | 11/2008 | Parker et al. | ................... | 362/331 |
| 7,511,423 B2 | 3/2009 | Noh et al. | | |
| 7,515,122 B2 | 4/2009 | Miller et al. | | |
| 7,712,932 B2 * | 5/2010 | Parker et al. | ................... | 362/337 |
| 7,864,271 B2 * | 1/2011 | Nakamura et al. | ............ | 349/109 |

(Continued)

FOREIGN PATENT DOCUMENTS

DE 60317734 T2 4/2008
DE 10 2008 057 848 A1 5/2010

(Continued)

*Primary Examiner* — Kent Chang
*Assistant Examiner* — Benjamin Morales Fernandez
(74) *Attorney, Agent, or Firm* — Marshall & Melhorn, LLC

(57) ABSTRACT

Display element with at least one color-generating cell of the first type which has an emissive light source, and with at least one color-generating cell of the second type which has a reflective and/or transmissive and/or transflective light source, whereby each cell of the second type can be driven so that it makes visible one of the chromatic colors red, green, blue, magenta, cyan and yellow and the achromatic colors white and black, to compensate at least partly for the absence of the color impression created by at least one color-generating cell of the first type on account of the ambient light of the display element.

7 Claims, 3 Drawing Sheets

(56) References Cited

U.S. PATENT DOCUMENTS

| | | | |
|---|---|---|---|
| 8,348,489 B2 * | 1/2013 | Holman et al. | 362/600 |
| 2002/0145687 A1 * | 10/2002 | Mitsui et al. | 349/113 |
| 2003/0012483 A1 * | 1/2003 | Ticknor et al. | 385/16 |
| 2004/0055536 A1 * | 3/2004 | Kolar et al. | 118/626 |
| 2005/0151709 A1 * | 7/2005 | Jacobson et al. | 345/84 |
| 2005/0237450 A1 * | 10/2005 | Hu et al. | 349/108 |
| 2006/0001653 A1 * | 1/2006 | Smits | 345/176 |
| 2007/0019006 A1 * | 1/2007 | Marcu et al. | 345/690 |
| 2007/0075935 A1 * | 4/2007 | Mesmer et al. | 345/76 |
| 2007/0153165 A1 * | 7/2007 | Hu et al. | 349/106 |
| 2007/0153172 A1 * | 7/2007 | Hsieh et al. | 349/114 |
| 2007/0164953 A1 * | 7/2007 | Huang et al. | 345/88 |
| 2007/0194702 A1 * | 8/2007 | Jeng et al. | 313/506 |
| 2007/0221484 A1 * | 9/2007 | Steckl et al. | 200/193 |
| 2008/0047762 A1 * | 2/2008 | Lieberman et al. | 178/18.01 |
| 2008/0093542 A1 * | 4/2008 | Lieberman et al. | 250/227.14 |
| 2008/0117231 A1 * | 5/2008 | Kimpe | 345/629 |
| 2008/0142376 A1 * | 6/2008 | Fouillet et al. | 205/775 |
| 2008/0303994 A1 | 12/2008 | Jeng et al. | |
| 2009/0316252 A1 * | 12/2009 | Muller-Marc et al. | 359/290 |
| 2010/0265215 A1 * | 10/2010 | Lai | 345/175 |
| 2011/0043435 A1 * | 2/2011 | Hebenstreit et al. | 345/5 |

FOREIGN PATENT DOCUMENTS

| | | |
|---|---|---|
| EP | 1090384 B1 | 4/2002 |
| WO | 0000947 A1 | 1/2000 |
| WO | 03048849 A1 | 6/2003 |

* cited by examiner

DISPLAY ELEMENT AND A METHOD FOR DRIVING A DISPLAY ELEMENT

This invention relates to a display element that can be used for the display of a plurality of colors and is characterized by, among other things, its good readability under poor ambient lighting conditions and an improved display of fine color gradations.

The prior art describes numerous varieties of displays, each of which is based on the use of individual pixels which are generally arranged in a specified grid pattern. For the display of the desired information, the information is first broken down into individual pixels which can then be displayed by means of the display elements.

Regardless of the technology preferred for the realization of the pixels, it is basically desirable to optimize the display elements of the prior art with regard to their resolution and accurate reproduction of color. The achievement of a high resolution requires the smallest pixels possible, which must also be arranged in a high density on the respective display element. The actual distance between the pixels must therefore be appropriately adapted to the resolution capability of the human eye and the conventional viewing distances. That requires that the display surface available must be utilized as efficiently as possible, i.e. the peripheral electronics of each pixel must be kept small, at least in the vicinity of the visible display surface.

Color content is generally produced either by superimposing pixels of different colors on top of one another or by placing pixels of different colors next to one another and thus generating the desired colors in the overall view by subtraction or blending. To be able to cover a large color space with fine graduations of color it is therefore absolutely necessary for the number of colors that can be combined with one another to be likewise high. In display elements of the prior art, the limiting factors in this regard are dictated by the technology used.

U.S. Pat. No. 7,511,423 B2 describes a display element in which organic light-emitting diodes (OLEDs) and a white light-emitting diode are combined with one another. However, this arrangement still has the disadvantage that the color space that can be presented is limited to the colors that can be realized using OLEDs, plus a white pixel on account of the presence of the additional LED.

U.S. Pat. No. 7,515,122 B2 describes a color display in which each pixel consists of four subpixels of different colors, two pixels of which emit at a higher intensity and two pixels of which emit at a lower intensity. The arrangement of the pixels is characterized by the fact that the higher-emission pixels are located in the same positions within each pixel relative to the adjacent pixels, while the positions of the lower-emission pixels differ in relation to the respective neighboring pixels, i.e. they are transposed. The display elements described in this prior art document are said to be characterized by an improved display quality, in particular with reference to jagged lines and a reduced tendency to banding. In this implementation of a color display, too, the maximum color space that can be presented is limited by the fact that only as many colors can be generated as can be composed directly from the four basic colors available.

WO 03/048849 A1 and DE 603 17 734 T2 each describe a display element in which self-illuminating and reflective or transmissive cells are provided in a stacked arrangement. US 2008/0303994 A1 describes a display device in which self-illuminating cells and reflective, transmissive or transflective cells are located in a common plane. The latter are realized in the form of light valves, the purpose of which is to modulate the light shining into the individual cells. The prior art teaches selecting the respective active type of cell as a function of the intensity of the ambient light.

The object of the invention is therefore a display element which is characterized by improved readability, a high pixel density and an expanded color space that can be displayed. An additional object of the invention is a method to drive a display element of this type.

This object is accomplished by a display element and by a method according to the invention. Advantageous developments of the invention and method are described.

The color space (gamut) of a display element is determined by its primary colors. There are conventionally three primary colors (RGB). The gamut is accordingly limited, corresponding to the color coordinates of the primary colors, by a triangle with a determined area and position. These coordinates are conventionally indicated in the CIE standard colorimetric system (CIE 1931).

All the colors inside the triangle are combined by different shades of grey, whereby the number of shades of grey corresponds to the number of colors that can be presented. The above mentioned mixing is done on the basis of the tristimulus values XYZ. For the mixing, these values are added and then transformed, e.g. according to the above referenced CIE 1931 color system.

If the color space is to be formed from more than three primary colors (e.g. SHARP QUATTRON®), the color space is expanded accordingly. The same is true for the display elements of this invention. With reference to the embodiment illustrated in FIG. 1, the CMY colors of the second type of cell can be selected so that their coordinates lie in the color space outside the RGB triangle formed by the OLED cells. It thereby becomes possible to expand the gamut of the overall display. The resulting gamut is a hexagon.

The mathematic and technical bases of this process (and also of the differentiation defined in Claim 1) are described in detail, for example, in F. W. Billmeyer, M. Salzmann, Principles of Color Technology, Wiley, New York and in P. Green, L. MacDonald, Colour Engineering, WILEY, New York, 3rd Edition (2000).

The invention makes available a display element with at least one color-generating cell of the first type which has an emissive light source, and with at least one color-generating cell of the second type which has a reflective and/or transmissive and/or transflective light source, whereby the cells are located next to one another and each cell of the second type can be driven as a function of the difference between a desired point in the color space and an actual point in the color space which corresponds to a modified color impression on account of the ambient light so that it makes visible at least one of the chromatic colors red, green, blue, magenta, cyan and yellow and the achromatic colors white and black, to at least partly compensate for the absence of the color impression produced by the at least one color-generating cell of the first type.

The display element taught by the invention therefore combines the advantages of emissive cells with those of reflective, transmissive or transflective cells. Reflective cells have advantages in environments where there is a high proportion of ambient light or for applications in which sufficient energy is not available to power the backlighting. Transmissive cells always require backlighting and are therefore appropriate if there is normally no interference from direct sunlight. Transflective cells have the capability of operating both reflectively and transmissively. Transflective cells can be used in direct sunlight and together with backlighting as well as in low light.

Preferably the emissive light source emits in the optically visible wavelength range. If the emissive light source is in the form of a light-emitting diode, it guarantees emission with a narrow wavelength spectrum. In one preferred embodiment, the emissive light source is an organic light-emitting diode (OLED). OLEDs are particularly well suited to filling up the RGB color space and also have the characteristic of a tunable emission spectrum. The tunability can relate to both the emission bandwidth as well as the emission intensity.

Preferably each color-generating cell of the second type has a stack of reservoirs one on top of another, whereby each reservoir can be filled either with a clear fluid or with a fluid that is of a magenta, cyan or yellow color. Cells of this type are described in EP 1 090 384 B1, among other prior art publications.

In one preferred embodiment, the reflective cell is used to compensate for any selective bleaching of the color spectrum generated by the three cells, each with an emissive light source, that is caused by the ambient light, whereby the light spectrum emitted by the cells of the first type is supplemented and/or its intensity is increased in the corresponding range by means of the cells of the second type. The display elements claimed by the invention are therefore particularly suitable for applications in which a high color fidelity is required or the influence of changing ambient light on the display is to be minimized. Preferably, the reflective cell does not add any white light to the spectrum emitted by the emissive cell or cells but in the case where the RGB color space is overlapped by the emissive light source or sources, for example, a spectral color that is composed of the colors cyan, magenta and yellow and therefore belongs to the CMY color space.

In an additional embodiment, the display element claimed by the invention has at least three cells of the first type that have different or only partly overlapping wavelength spectra. If the cells in question are one red, one green and one blue emissive light source, such an embodiment already covers the RGB color space. It can thereby be desirable to provide the light sources with variable emission intensities. Light sources of this type are described in the prior art. To protect the emissive light sources that are used, in particular OLEDs, one or more of these light sources can be temporarily deactivated. Such a deactivation is appropriate in particular if, for example, the visibility of certain color spectra is limited on account of the ambient light.

In one preferred embodiment, the at least one color filter is a fluid which can be conducted into the optical path of the light inside the cell of the second type. Preferably the light shining into the second cell can be modulated by means of a plurality of such filters of different colors, whereby although the fluid color filters in the display element are separate from one another, they can also all be moved simultaneously, or only a subset of the filters can be moved into the optical path of the light inside the cell as necessary, so that the incident light passes through them at least once before it exits the cell. It is advantageous if the color filters, at least if they are in the optical path of the incident light, are located one behind another in the direction of propagation of the light, so that they have a subtractive effect on the incident or reflected light.

The fluid color filters are preferably transported by means of electrowetting, whereby the fluid can be moved between a first and a second reservoir and whereby only one of the reservoirs is at least partly in the optical path of the light inside the cell of the second type. It is conceivable that the reservoir which is not in the optical path is covered, in the viewing direction of the display element from above, by the at least one cell of the first type. That guarantees on one hand that the additional reservoir that is not located in the cell of the second type does not occupy any space on the surface of the display element and therefore does not contribute to a reduction of the switchable surface, and on the other hand that it is not visible to a viewer of the display element.

In an additional embodiment of the invention, the reflector divides the cell of the second type into two subspaces, whereby in the viewing direction of the display element from above only one of the subspaces is visible, and whereby for each color filter, the reservoir that is not in the optical path of the light is in the subspace that is not visible. In this embodiment, therefore, the reflector performs not only the function of reflecting the ambient light that shines into the cell after it passes through the filter, if it is located in the corresponding subspace, but also of making the reservoir of the color filter optically invisible.

In an additional embodiment of the invention, the color filters are located on the boundary walls of the second cell and the reflector optionally encloses an angle between 0° and 90° with at least one wall, so that light that shines into the cell and is reflected on the respective boundary wall is reflected back out of the cell by the reflector. For the realization of an image element of this type the reflector must be adjustable, at least in terms of its angle with respect to the respective boundary wall, and it must also be possible to rotate the reflector in the plane parallel to the surface of the display element. Cells of this type are described in German Patent Application DE 10 2008 057 848.7.

For the achievement of a more finely graduated tonality, the display elements claimed by the invention can also be used as subpixels of a higher-level pixel which has a plurality of display elements. For example, with a pixel that has 4×4 display elements it is possible to realize 245,157 shades from the color space composed of the RGB and CMY color spaces.

The method claimed by the invention for driving a display element which is constructed from at least one color-generating cell of the first type which has an emissive light source and at least one color-generating cell of the second type which has a reflective and/or transmissive and/or transflective light source, whereby the cells are located next to one another, is characterized in that the color-generating cell(s) of the first type is/are driven to generate a color impression that corresponds to a desired pixel in a color space, the difference between the desired point in the color space and an actual point in the color space which corresponds to a color impression that is modified on account of the ambient light of the display element is determined, and the color generating cell(s) of the second type is/are driven to minimize the difference, whereby each cell of the second type can be driven so that it makes at least one of the chromatic colors red, green, blue, magenta, cyan and yellow and the achromatic colors white and black visible, and/or at least one color generating cell of the first type is driven to minimize the difference.

Additional details of the invention are explained in greater detail below with reference to the exemplary embodiments illustrated schematically in the accompanying drawings, in which.

Figure 1:
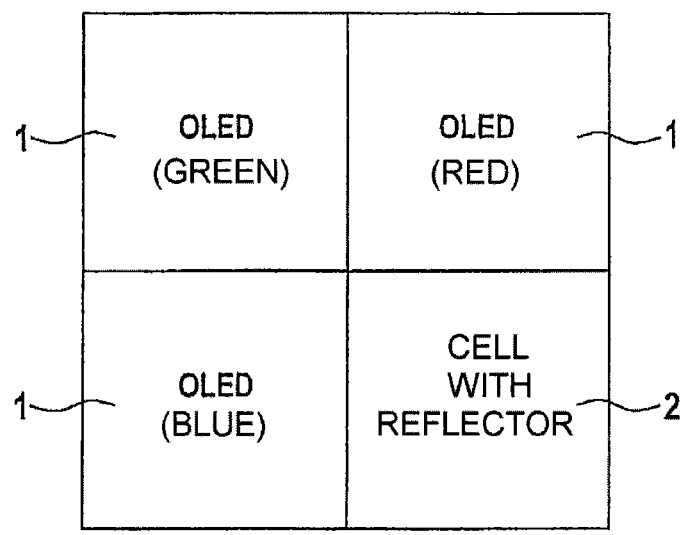
FIG. 1 is a schematic plan view of a display element claimed by the invention.

FIG. 1 is a schematic plan view of a display element claimed by the invention. The display element consists of three cells of the first type 1, each with one red, one green and one blue organic light-emitting diode (OLED), and a cell of the second type 2, with a reflector 3. In the overhead view the display element is essentially square, whereby each of the above mentioned cells (1, 2) in the overhead view has a square visible surface. Preferably the first cells 1 with the OLED light source are used to cover the RGB color space, so that by means of the cell of the second type 2, and using correspondingly colored filters of the RGB color space, the RGB color space can be supplemented by the colors that result from the filtering of the incident ambient light with filters 4 of the colors cyan, magenta and yellow. The cells of the second type 2 also supplement the color space that can be realized by the two achromatic colors white and black, whereby a white pixel is generated because none of the color filters 4 is located in the optical path of the incident ambient light in the cell of the second type 2 and thus there is no change in color. The ability to generate a white pixel, however, depends on the color spectrum or on the color temperature of the ambient light. A black pixel results when all of the three above mentioned color filters 4 are located in the optical path of the incident light in the cell of the second type 2, and therefore, depending on the spectrum of the ambient light, results in a more or less complete absorption of the light. Conventional semiconductor-based LEDs can also be used instead of organic light-emitting diodes.

Figure 2:
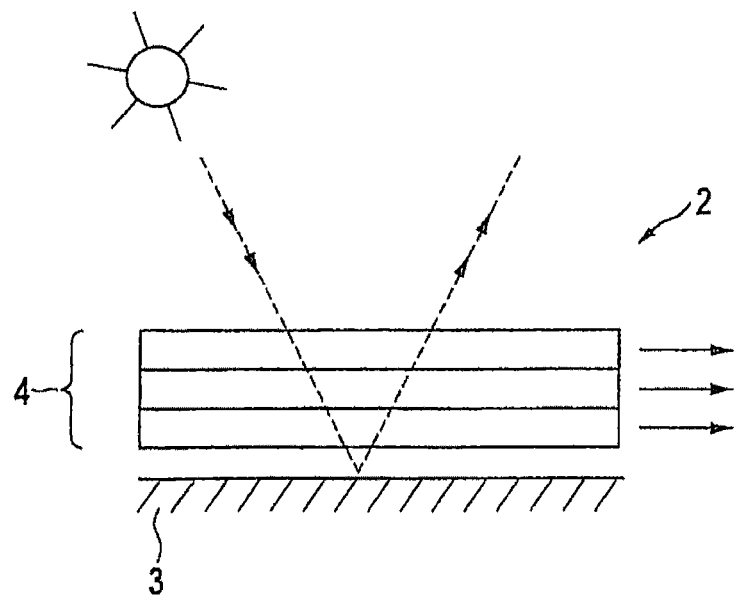
FIG. 2 is a schematic side view of one example of a cell of the second type of a display element claimed by the invention.

FIG. 2 is a schematic side view of a cell of the second type 2 with a reflector 3 and a color filter package 4, whereby the color filters 4 in a display element of the type illustrated in FIG. 1 can cover the colors cyan, magenta and yellow, for example. For the modulation of the incident ambient light, optionally all of the color filters 4, individual color filters 4 or pairs of color filters 4 can be introduced into the optical path of the incident light. In the illustration in FIG. 2, that can be done, for example, as indicated by the arrows, by moving individual color filters 4 or all of the color filters 4 laterally out of the area illustrated which is visible to the observer. If the color filters 4 are in the form of fluids, the invention teaches that it is particularly advantageous if the color filters are transported between a first and a second reservoir by means of the electrowetting effect. Two possible implementations of this particularly advantageous realization of the display element claimed by the invention and or the relevant cells of the second type 2 are illustrated schematically in FIGS. 3 and 4.

Figure 3:
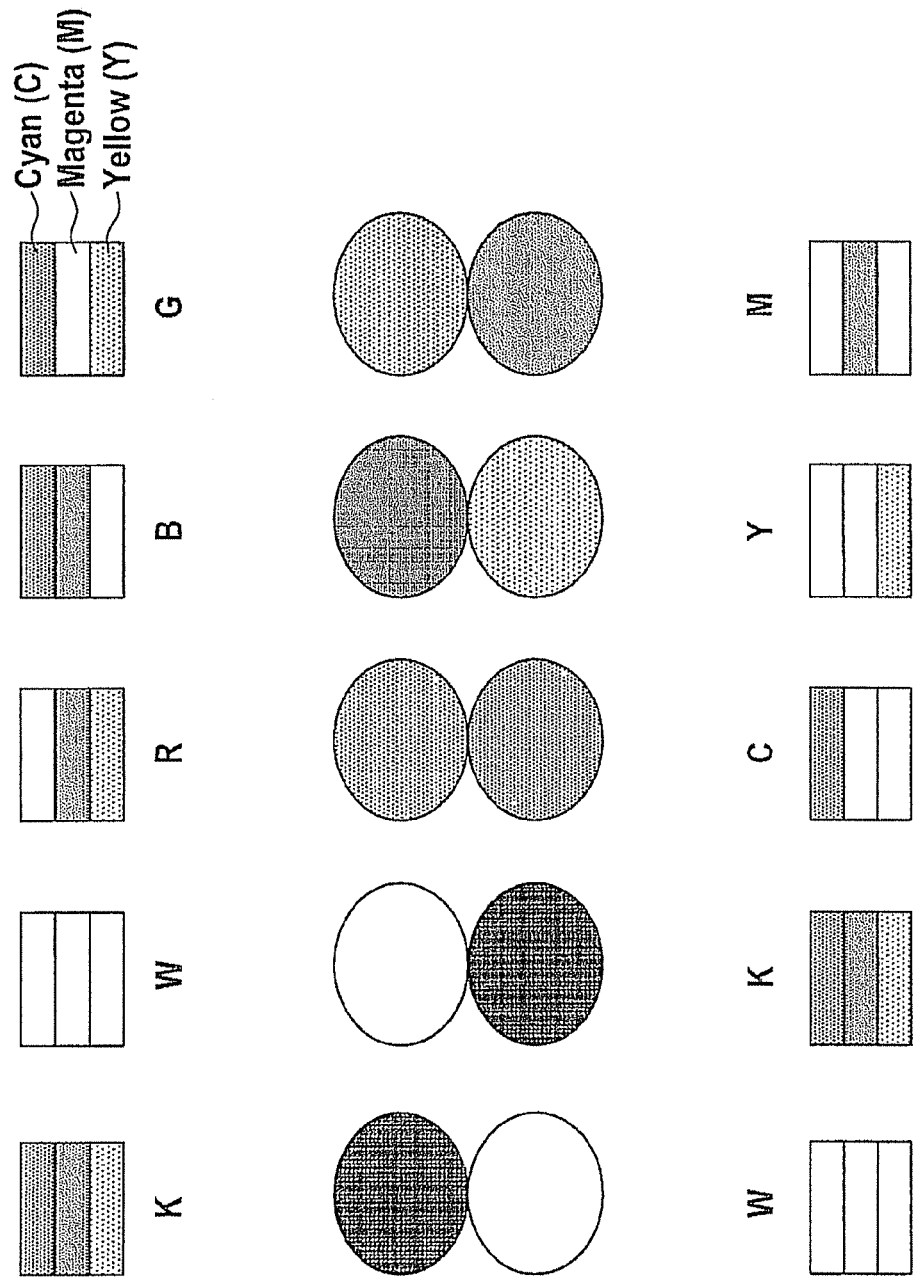
FIG. 3 is an illustration explaining the formation of the colors for a cell of the second type.

FIG. 3 shows how the colors red, blue, green, cyan, yellow, magenta, white and black can be formed by means of a stack of three reservoirs lying one on top of another, in each of which one of the colors cyan, magenta or yellow is brought into the pixel window. In each stack the uppermost subpixel in each stack in the illustration is provided for cyan, the middle subpixel is for magenta and the bottom subpixel is for yellow. For purposes of clarity in the illustration, if "yellow" is brought into the pixel widow, it is shown shaded. Thus white (W) can be presented by bringing none of the colors cyan, magenta or yellow into the pixel window. Black (S) can be achieved by bringing all the colors into the pixel window, and cyan (C), yellow (Y), and magenta (M) by bringing the corresponding color or colors into the pixel window. Red (R) can be achieved by bringing magenta and yellow into the pixel window, blue (B) by bringing cyan and magenta into the pixel window and green (G) by bringing cyan and yellow into the pixel window.

Figure 4:
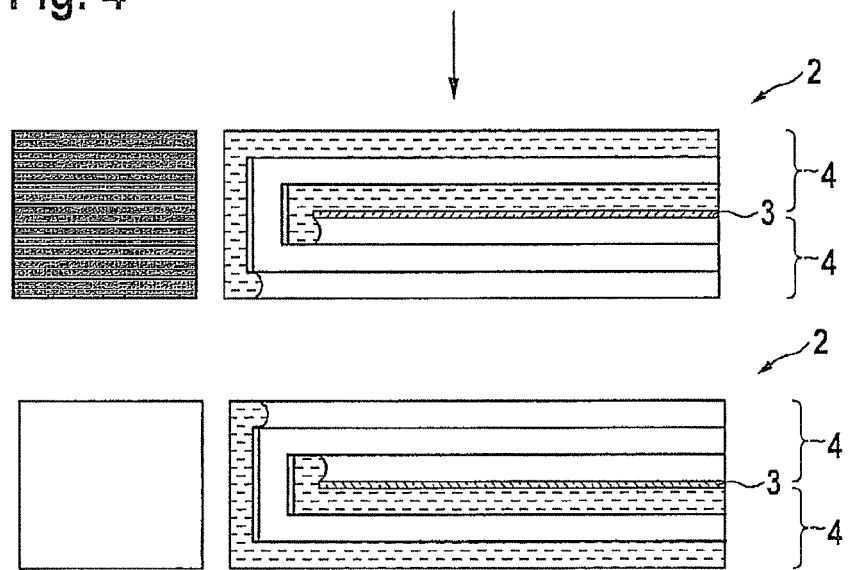
FIG. 4 is a schematic side view of an additional embodiment of the cell of the second type of the display element claimed by the invention.

FIG. 4 shows a cell of the second type 2 in which a reflector 3 divides the space enclosed by the cell into two subspaces, so that in an overhead view, in the direction indicated by the arrow, the lower subspace in the viewing direction is covered by the reflector 3 and is therefore not visible. The figure also shows that the color filters 4 are in the form of fluids and, depending on the desired spectrum of the light reflected out of the cell 2, can be moved optionally into the upper subspace in the viewing direction and thus into the optical path of the incident light or, if some or all of the color filters 4 are not located in the optical path of the light, into the bottom subspace in the viewing direction. FIG. 3 shows schematically two adjustment positions of the fluid filters 4, whereby in the upper cell all three color filters 4 are in the optical path of the incident light, so that the incident light is completely or at least mostly absorbed by the color filters 4 and a black pixel is generated. If, as in the bottom example, there are no color filters 4 in the optical path, the incident light is reflected back unmodulated and therefore, provided that the incident light has an appropriate color spectrum, a white pixel is generated. In the embodiment illustrated in FIG. 3 the respective filter 4 is preferably moved by means of the electrowetting effect between a first and second reservoir, whereby one of the reservoirs is located above the reflector 3 and the other below. The invention teaches that the illustrated folded and stacked arrangement of the reservoirs around the central reflector 3 is particularly appropriate for this purpose.

Figure 5:
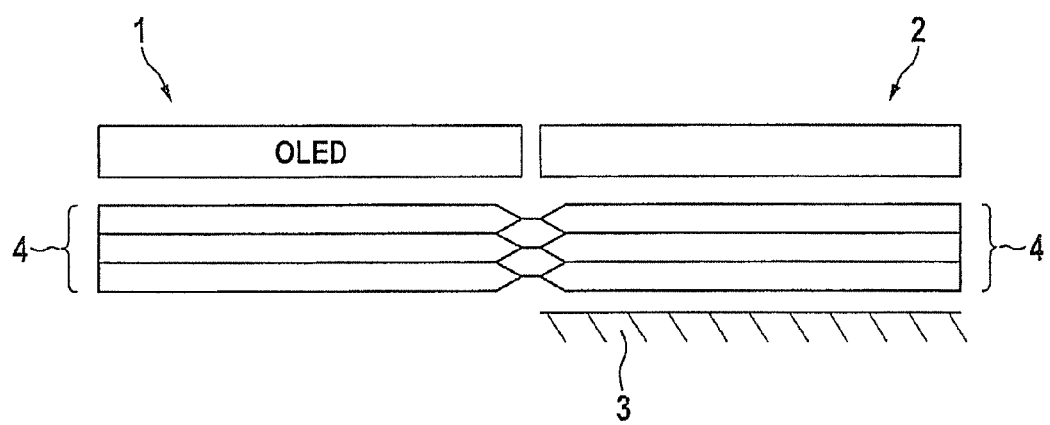
FIG. 5 is a schematic side view of a display element claimed by the invention.

FIG. 5 is a schematic side view of an additional embodiment of the display element claimed by the invention with the use of fluid color filters 4. The side view shows a cell of the first type 1 with an OLED and a cell of the second type 2 with a reflector 3 below the first reservoirs in the viewing direction, for the color filters 4. In the illustrated embodiment the second reservoirs for the color filters 4 are located in the viewing direction below the surface which is covered by the OLEDs or at least by one OLED, and is thus not visible to the observer. Therefore if a color filter 4 is not located in the optical path of the light shining into the cell 2, it is kept in one of the second reservoirs below the surface covered by the OLEDs where it is not visible. Optionally the reservoirs that are not in the optical path of the light in the cell 2 can be located underneath one or more OLEDs. For the realization of a display element which is also compact in the dimension perpendicular to the surface of the display element, it is advantageous if, in the embodiment illustrated in FIG. 1, for example, in which the cell of the second type comprises the color filters cyan, magenta and yellow, if one of the reservoirs is located below one of the cells of the first type 1, which is therefore not in the optical path of the light shining into the cell of the second type 2.

Thee characteristics of the invention described in this description, in the accompanying drawing and in the claims can be considered essential for the realization of the invention both individually and in any arbitrary combination.

The invention claimed is:

1. Display element with at least one color-generating cell of a first type (1), which has an emissive light source, and with at least one color-generating cell of a second type (2), which has a reflective and/or transmissive and/or transflective light source comprising a stack of first reservoirs lying one on top of one another, and a respective number of second reservoirs, whereby each of said first reservoirs is adapted to be selectively filled with a clear fluid, or with a magenta-colored, cyan-colored or yellow-colored fluid, wherein each individual fluid can be moved between one of said first and one of said second reservoirs, and whereby only the stack of first reservoirs is in the optical path of the light inside the cell of the second type (2), whereby the cells (1, 2) are located next to one another and each cell of the second type (2) is driven as a function of the difference between a desired point in the color space and an actual point in the color space which corresponds to a modified color impression on account of the ambient light of the display element, so that it makes visible at least one of the chromatic colors red, green, blue, magenta, cyan and yellow and the achromatic colors white and black, to compensate at least partly for the absence of the color impression produced by the at least one color-generating cell of the first type (1).

2. Display element as recited in claim 1, characterized in that the color-generating cells of the first type (1) each emit one of the colors red, green or blue.

3. Display element as recited in claim 1, characterized in that the color-generating cells of the first type (1) can be driven independently of one another.

4. Display element as recited in claim 1, characterized in that the emissive light source is a semiconductor-based LED or an organic LED.

5. Display element as recited in claim 1, characterized in that the fluids are transported by electrowetting.

6. Display element as recited in claim 5, characterized in that, when the display element is viewed from above, the reservoir that is not located in the optical path is covered by the at least one cell of the first type (1).

7. Method for driving a display element which is constructed from at least one color-generating cell of a first type (1) which has an emissive light source, and at least one color-generating cell of a second type (2) which has a reflective and/or transmissive and/or transflective light source, comprising a stack of first reservoirs lying one on top of one another, and a respective number of second reservoirs, whereby each of said first reservoirs is adapted to be selectively filled with a clear fluid, or with a magenta-colored, cyan-colored or yellow-colored fluid, wherein each individual fluid can be moved between one of said first and one of said second reservoirs, and whereby only the stack of first reservoirs is in the optical path of the light inside the cell of the second type (2), whereby the cells (1, 2) are located next to each other, the method comprising the following steps:

driving the color-generating cell(s) of the first type to generate a color impression that corresponds to a desired point in a color space, determining the difference between the desired point in the color space and an actual point in the color space which corresponds to a modified color impression on account of the ambient light of the display element, and driving the color-generating cell(s) of the second type (2) to minimize the difference, whereby each cell of the second type (2) is driven so that it makes visible at least one of the chromatic colors red, green, blue, magenta, cyan and yellow and the achromatic colors white and black, and/or driving at least one color-generating cell of the first type (1) to minimize the difference.

* * * * *